United States Patent
Haubursin et al.

(10) Patent No.: US 6,340,898 B1
(45) Date of Patent: Jan. 22, 2002

(54) METHOD AND SYSTEM FOR SWITCHING BETWEEN A TOTEM-POLE DRIVE MODE AND AN OPEN-DRAIN DRIVE MODE

(75) Inventors: Pierre Haubursin, Sunnyvale; Ching Yu, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/993,122

(22) Filed: Dec. 18, 1997

(51) Int. Cl.$^7$ ............................................. H03K 19/173
(52) U.S. Cl. ............................... 326/49; 326/56; 326/82
(58) Field of Search ............................... 326/56–58, 49, 326/50, 82, 83, 86

(56) References Cited

U.S. PATENT DOCUMENTS

| | | | | |
|---|---|---|---|---|
| 5,519,345 A | * | 5/1996 | Farrell et al. | 326/56 |
| 5,530,379 A | * | 6/1996 | Konishi et al. | 326/49 |
| 5,568,081 A | * | 10/1996 | Lui et al. | 326/83 |
| 5,592,509 A | * | 1/1997 | McClera et al. | 326/30 |
| 5,612,637 A | * | 3/1997 | Shay et al. | 326/86 |
| 5,629,634 A | * | 5/1997 | Carl et al. | 326/83 |
| 5,696,994 A | * | 12/1997 | Pang | 327/334 |
| 5,701,514 A | * | 12/1997 | Keener et al. | 395/834 |
| 5,811,997 A | * | 9/1998 | Chengson et al. | 326/83 |
| 5,864,243 A | * | 1/1999 | Chen et al. | 326/83 |
| 5,926,034 A | * | 7/1999 | Seyyedey | 326/82 |

* cited by examiner

Primary Examiner—Jon Santamauro
Assistant Examiner—Don Phu Le

(57) ABSTRACT

An output driver that may be configured to operate as a totem-pole driver, or as an open-drain driver. The output driver comprises a totem-pole driver coupled to an output pin. A control circuit is coupled to the output enable input of the totem-pole driver. The control circuit is supplied with an open-drain control signal controlled by the user interface. When the open-drain control signal is at a first logic level, the output driver operates as an open-drain driver. When the open-drain control signal is at a second logic level, the output driver is configured to operate as a totem-pole driver.

11 Claims, 5 Drawing Sheets

| OD | EN | A | O | Mode |
|---|---|---|---|---|
| 0 | 0 | 0 | z | Totem-pole |
| 0 | 0 | 1 | z | Totem-pole |
| 0 | 1 | 0 | 0 | Totem-pole |
| 0 | 1 | 1 | 1 | Totem-pole |
| 1 | 0 | 0 | z | Open-drain |
| 1 | 0 | 1 | z | Open-drain |
| 1 | 1 | 0 | 0 | Open-drain |
| 1 | 1 | 1 | z | Open-drain |

METHOD AND SYSTEM FOR SWITCHING BETWEEN A TOTEM-POLE DRIVE MODE AND AN OPEN-DRAIN DRIVE MODE

1. Field of the Invention

The present invention relates to data networks, and more particularly, to a control system that allows a totem-pole output driver to be configured as an open-drain output driver.

2. Background Art

The growth in computer applications that require heavy data traffic and the increasing availability of high-speed transmission lines and intelligent communication switches create a need for computer systems able to manage a huge amount of data at high rates. For example, high-speed communication networks may require a central processing unit (CPU) to be interrupted at rates of 20,000–100,000 interrupts per second in response to hundreds various events.

In a network controller chip, interrupt signals to an external CPU are sent via an output driver connected to an interrupt pin of the chip. In some applications, a totem-pole driver is used as the output driver, whereas in other applications an open-drain driver is employed.

As shown in FIG. 1, an exemplary totem-pole output driver 10 for driving an output of a chip may comprise a pair of P-type and N-type MOS transistors P1 and N1 connected between a voltage source Vcc and a ground terminal. The transistor P1 may act as a pull-up transistor, and the transistor N1 may be a pull-down transistor. A data signal from internal logic of the chip may be supplied to an input A of the driver 10. An output enable signal that controls data output from the output driver 10 may be supplied to a control input EN of the driver 10.

A NOR gate 12 may be arranged for driving the pull-up transistor P1. The NOR gate 12 may have its inputs connected to the inputs A and EN, and its output couples to the gate of the transistor P1. The output enable signal may be supplied to the NOR gate 12 via an inverter 14.

a NAND gate 16 that drives the pull-down transistor N1 receives the data signal from the input A and the output enable signal from the control input EN. The output signal of the NAND gate 16 is supplied to the gate of the transistor N1.

An output node O provided at the junction between the transistors P1 and N1 may be connected to an output pin of a controller chip, for example, to an interrupt pin for supplying interrupt signals to an external CPU. The totem-pole driver 10 is a tri-state device. Its output may be driven high, low, or to a high-impedance state.

The data output from the output driver 10 may be enabled when the output enable signal at the EN input is at a logic 1 level. When the data output is enabled, the output signal of the output driver 10 is driven high in response to a high level at the data input IN, and is driven low in response to a low level at the data input IN. When the output enable signal is at a logic 0 level, the output driver 10 is in a high-impedance state, and the data output is disabled.

Referring to FIG. 2, an exemplary open-drain output driver 20 for driving an output of a chip may comprise a single N-type MOS transistor N2 coupled between an output node O and a ground terminal. The transistor N2 is driven by a NAND gate 22 coupled to a data input A for receiving a data input signal from internal logic of the chip, and to a control input EN supplied with an output enable signal for enabling data output.

By contrast with the totem-pole driver 10, the open-drain driver 20 has two states. When its data output is enabled by the output enable signal, the open-drain output driver 20 drives the output low in response to a low level of a data input signal supplied from internal logic circuitry. However, when the data input is at a high level, the open-drain driver 20 is switched into a high-impedance state. If the data output is disabled, the open-drain driver 20 is maintained in a high-impedance state regardless of the data input level.

As illustrated in FIG. 3(a), the totem-pole output driver 10 may drive an output interrupt pin 30 of a controller to supply an interrupt signal to an input interrupt driver 40 of an external CPU via its input interrupt pin 50. The totem-pole driver may be used to send an interrupt produced by a single controller to the CPU.

The advantage of an open-drain output driver over a totem-pole output driver is in providing a user with ability to perform an OR logical operation for interrupts produced by multiple controllers. Referring to FIG. 3(b), the open-drain output drivers 20-1, 20-2, 20-n allow a user to combine interrupts supplied from interrupt pins 30-1, 30-2, 30-n of n controllers interacting with the CPU in a communications system. An interrupt signal produced at any one of the interrupt pins 30-1, 30-2, 30-n will be transmitted to the input interrupt driver 40 of the CPU via the input pin 50. An external resistor 60 may be used to provide an interrupt interface.

Thus, to enable a user to provide interrupts from a single controller or to combine interrupts from multiple controllers, separate interrupt pins should be arranged on a controller chip for driving interrupts in a totem-pole drive mode and in a open-drain drive mode. However, it would result in increasing the total number of pins on the chip.

To produce interrupt signals in totem-pole and open-drain drive modes without increasing the number of interrupt pins, it would be desirable to provide a control circuit that allows a totem-pole output driver to function as an open-drain output driver.

DISCLOSURE OF THE INVENTION

Accordingly, a primary object of the present invention is to provide a system for enabling a user to configure a totem-pole driver to operate in an open-drain drive mode.

The above and other advantages of the invention are achieved, at least in part, by providing an output driver for driving an output pin on a chip. The output driver comprises a totem-pole driver coupled to the output pin. A control circuit is coupled to a control input of the totem-pole driver for configuring the driver to operate in an open-drain drive mode when a mode control signal has a first logic value, and for configuring the driver to operate in a totem-pole drive mode when the mode control signal has a second logic value.

In accordance with a preferred embodiment of the present invention, the control circuit may comprise a first gate circuit having a first input supplied with a data input signal representing data to be supplied from the output pin, and a second input supplied with the mode control signal. A second gate circuit may have a first input coupled to the output of the first gate circuit via an inverter. A second input of the second gate circuit may be supplied with an output enable signal. The output of the second gate circuit may be coupled to the control input of the totem-pole driver. The mode control signal may be programmed by a user.

In accordance with one aspect of the invention, the output driver may be used for driving an interrupt request output in a PCI interface.

In accordance with a method of the present invention, the following steps are carried out for controlling an output driver:

supplying the output driver with a first mode control signal for maintaining the output driver in a totem-pole drive mode, and supplying the output driver with a second mode control signal for switching the output driver into an open-drain drive mode.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIGS. 4, 4A and 4B are block diagrams illustrating an exemplary network interface, in which the present invention may be implemented.

BEST MODE FOR CARRYING OUT THE INVENTION

The present invention will be described with the example of a network interface in a packet switched network, such as an Ethernet (IEEE 802.3) network. It will become apparent, however, that the present invention is applicable to any output driver in any data processing system.

Figure 4A:
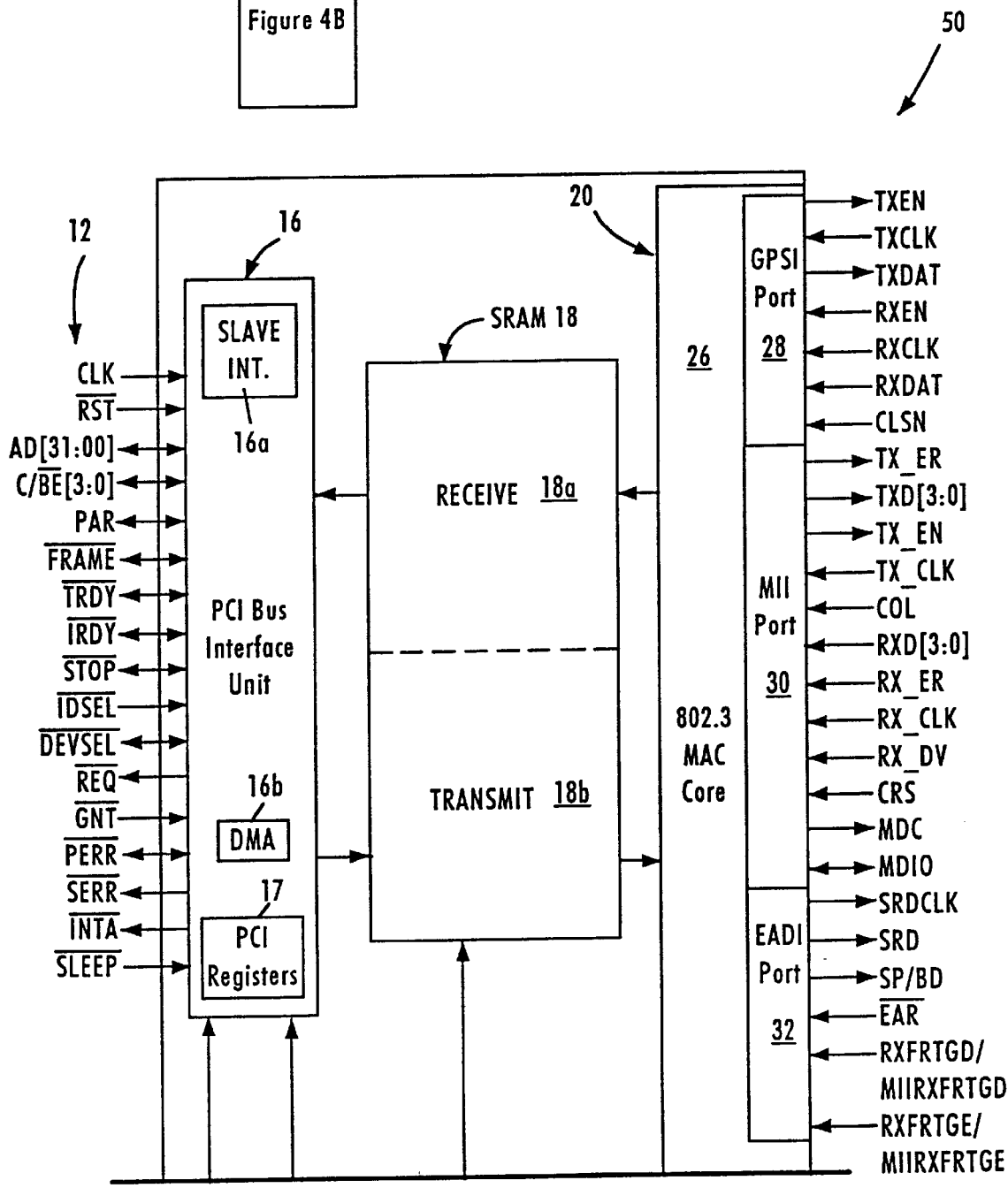
Figure 4B:
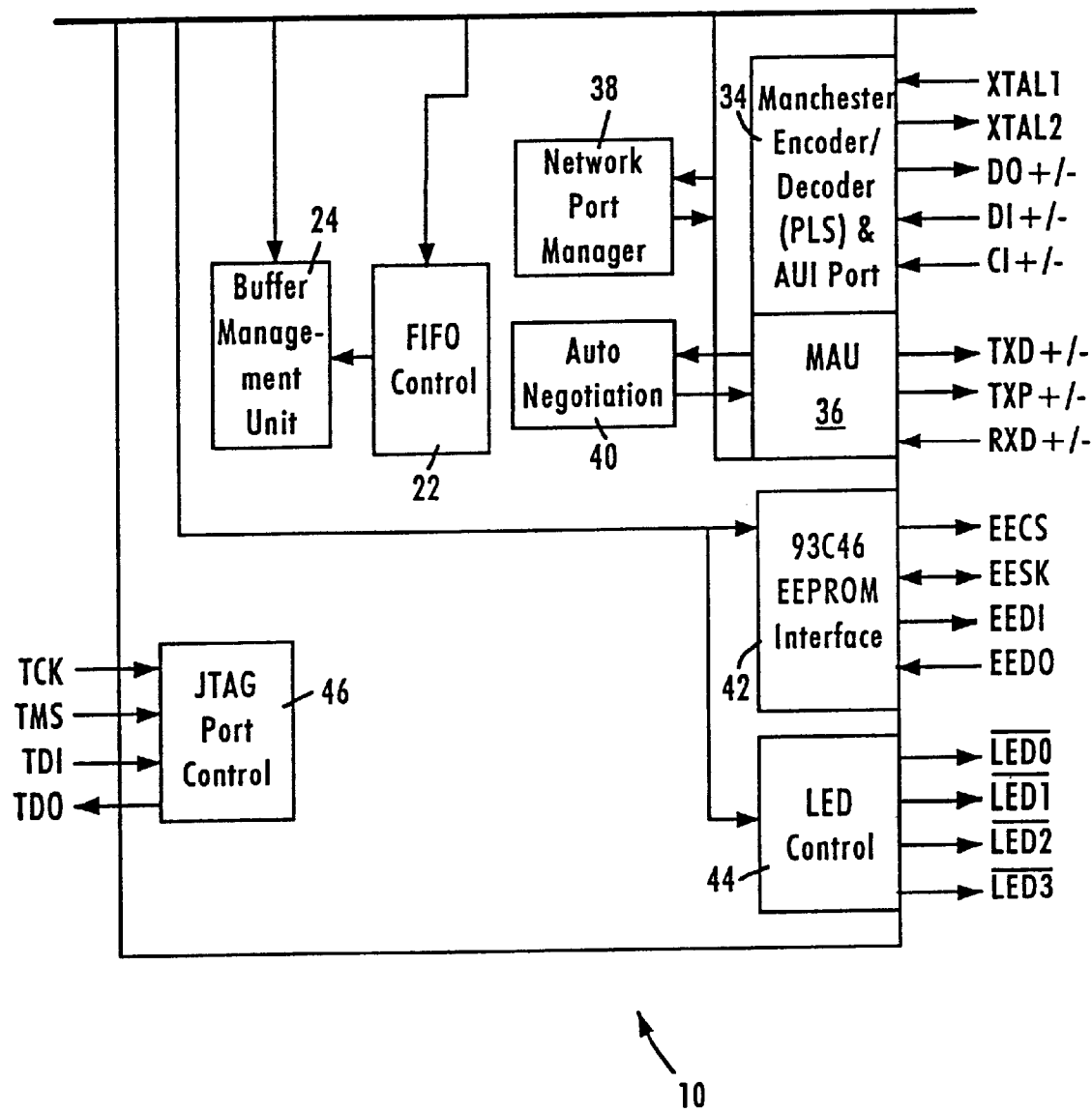

FIG. 4 is a block diagram of an exemplary network interface 10 that accesses the media of an Ethernet (ANSI/IEEE 802.3) network.

The network interface 10, preferably, a single-chip, 32-bit Ethernet controller, provides an interface between a local bus 12 of a computer, for example a peripheral component interconnect (PCI) local bus, and an Ethernet-based media 50.

The interface 10 includes a PCI bus interface unit 16, a buffer memory portion 18, and a network interface portion 20. The PCI bus interface unit 16 may provide an interface with an external CPU or other host via the PCI local bus. The PCI bus interface unit 16 may include a PCI slave interface 16a and a DMA interface 16b. The slave interface 16a manages PCI control and status information including reading and programming of the PCI status registers, but may also be configured for managing slave transfers via the PCI bus with a host CPU. The DMA interface 16b manages DMA transfers by the network interface 10 to and from system memory. Hence, the PCI bus interface unit 16 can be selectively configured for PCI transfers in slave and/or master (e.g., DMA) mode.

In accordance with the PCI local bus specification, revision 2.1, the PCI bus interface unit 16 has an interrupt request output INTA/ used for supplying the CPU or a host with an interrupt request signal. The network interface 10 produces the interrupt request signal to indicate that one or more of status flags are set. The status flags may represent such events as receive or transmit interrupt, system error, user interrupt, etc. The routine of the interrupt may be programmed in PCI configuration and setup registers 17 initialized by the system initialization procedure or device driver.

The memory portion 18 includes a 16-bit SRAM implemented directly on the network interface chip 10. According to the disclosed embodiment, the SRAM 18 may be accessed in a random access manner under the control of a first in, first out (FIFO) control unit 22, or may be segmented into a receive portion 18a and a transmit portion 18b for receive and transmit paths, respectively.

The network interface 10 also includes a buffer management unit 24 configured for managing DMA transfers via the DMA interface 16b. The buffer management unit 24 manages DMA transfers based on DMA descriptors in host memory that specify start address, length, etc. The buffer management unit 24 initiates a DMA read from system memory into the transmit buffer 18b by issuing an instruction to the DMA interface 16b, which translates the instructions into PCI bus cycles. Hence, the buffer management unit 24 contains descriptor management for DMA transfers, as well as pointers associated with storing and reading data from the memory portion 18. Although the buffer management unit 24 and the memory controller 22 are shown as discrete components, the two units may be integrated to form a memory management unit controlling all transfers of data to and from the memory unit 18.

The network interface portion 20 includes a media access control (MAC) core 26, a general purpose serial interface (GPSI) 28, a media independent interface (MII) 30 for connecting to an external 10 Mb/s or 100 Mb/s Physical transceiver (PHY), an external address detection interface (EADI) 32, an attachment unit interface (AUI) 34 having a Manchester encoder and decoder, and a 10/100 Mb/s twisted pair transceiver media attachment unit (MAU) 36.

The network interface 10 also includes a network port manager 38 configured for performing MII handshaking between two devices on an MII bus via the MII port 30. Such MII handshaking is performed in accordance with the IEEE 802.3 protocols, and may include link and programming information exchange at the MII layer using a management data clock (MDC), and management data input/output (MDIO) paths defined in the IEEE 802.3 standard.

The auto-negotiation portion 40 performs IEEE-compliant negotiation with a link partner on the PHY layer to exchange data indicating whether the link partner is capable of operating at 10 Mb/s, 100 Mb/s, and whether the link should be half-duplex or full-duplex.

The LED controller 44 selectively controls the generation of LED output signals based upon the internal decoding logic and network interface status registers (not shown). The network interface 10 also includes an IEEE 1149.1-compliant JTAG boundary scan test access port interface 36.

Figure 1:
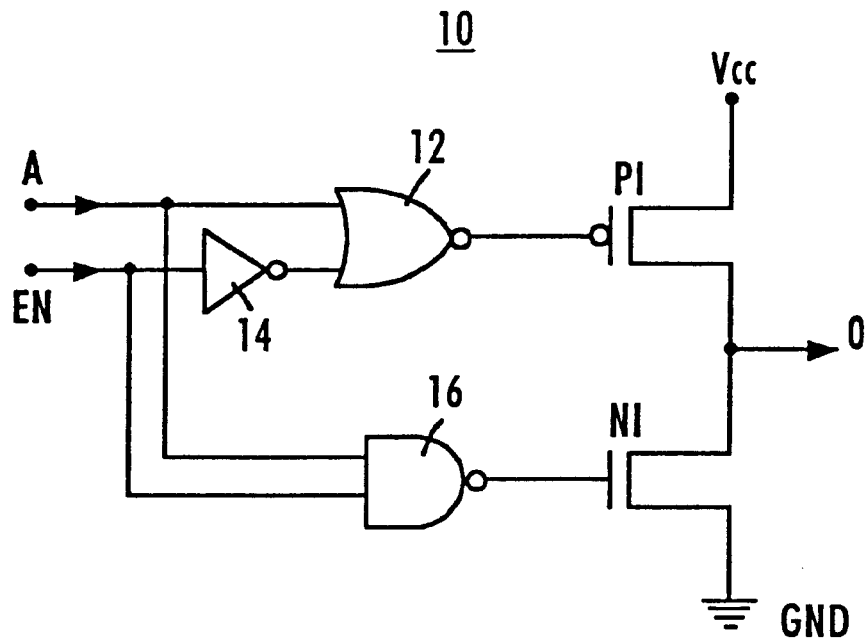
FIG. 1 is a diagram illustrating an exemplary totem-pole output driver.
Figure 2:
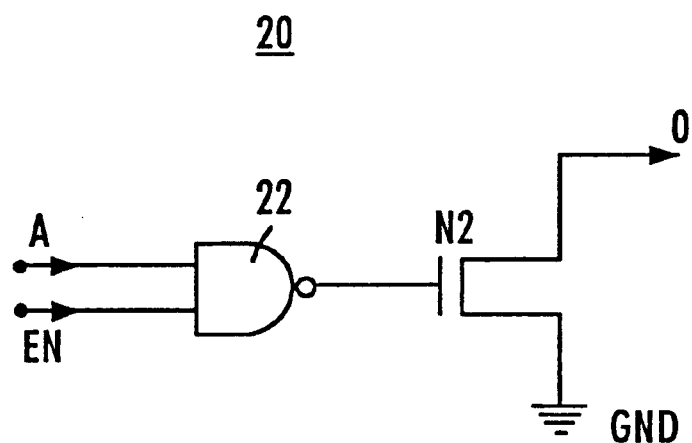
FIG. 2 is a diagram showing an exemplary open-drain output driver.
Figure 3A:
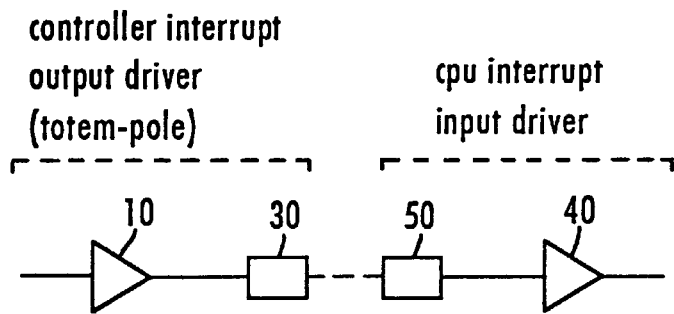
FIG. 3(a) illustrates a totem-pole output driver for driving interrupt output of a controller.
Figure 3B:
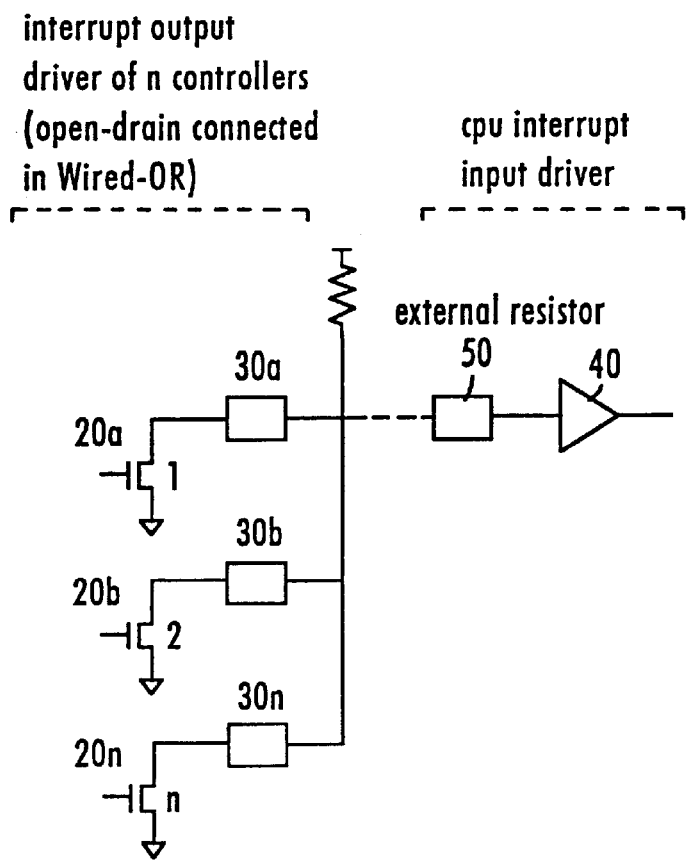
FIG. 3(b) illustrates open-drain output drivers connected in a wired-OR circuit for driving interrupt outputs of multiple controllers.

The EEPROM interface 42 connects to an EEPROM on either a network interface adapter card or the motherboard of the host computer via a serial interface link. The EEPROM (not shown in FIG. 1) will be programmed with configuration information related to the network interface, enabling the network interface to be configured during initialization via the EEPROM interface 42. Once initialized, the network interface stores the configuration information in internal registers (not shown), enabling the network interface to operate independently of the host computer in the event the host computer is powered down.

As discussed above, the PCI bus interface unit 16 has an interrupt request output INTA/ for supplying an external CPU or other host with an interrupt request signal.

In accordance with the present invention, the user is enabled to use a single output driver for driving the interrupt request output in either totem-pole drive mode or open-drain drive mode.

Figures 5, 6:
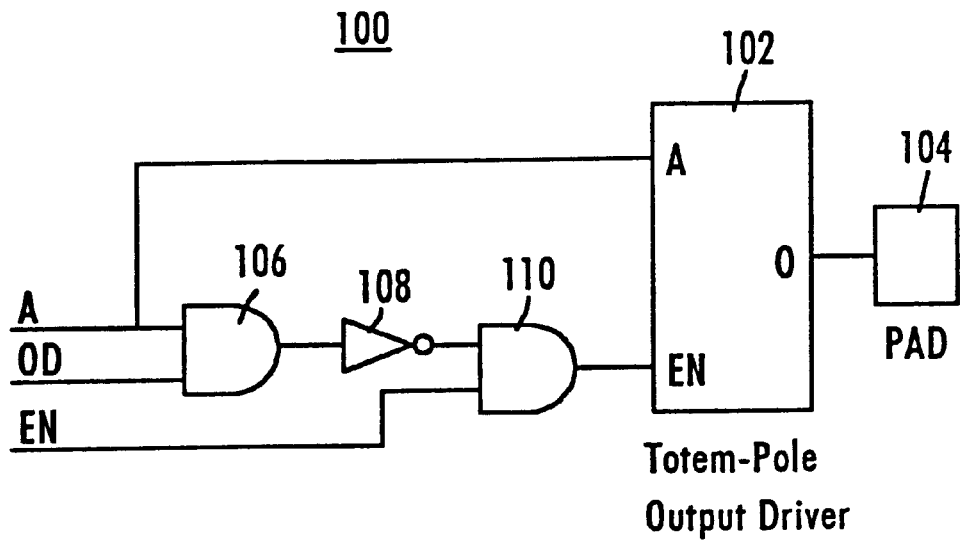
FIG. 5 is a diagram of an output driver of the present invention.
FIG. 6 is a table illustrating logical values of signals in the output driver in open-drain and totem-pole drive modes.

Referring to FIG. 5, an output driver 100 is provided for driving the interrupt request output INTA/. The output driver 100 comprises a totem-pole output driver 102 having a data input A for receiving interrupt data from internal logic circuitry of the PCI bus interface unit 16, for example, from interrupt portions of the PCI configuration and setup registers 17. An output enable input EN of the driver 102 provides a control signal for enabling or disabling data output from an output O of the driver 102. The output O is coupled to an output pin 104, such as the interrupt request pin INTA/ of the PCI bus interface 16. For example, the totem-pole output driver 102 may have a structure similar to the structure of the exemplary driver shown in FIG. 1.

To enable the user to configure the output driver 100 so as to drive the output pin 104 in an open-drain mode, a drive mode control circuit is coupled to the totem-pole driver 104. The drive mode control circuit comprises an AND gate 106 coupled to the data input A for receiving data from internal logic circuitry of the PCI bus interface unit 16. The other input of the AND gate 106 receives an open-drain control signal OD that controls switching of the output driver 100 between an open-drain drive mode and a totem-pole drive mode.

For example, when the OD signal is at a logic 1 level, the output drive 100 is configured to operate as an open-drain driver. When the OD signal is at a logic 0 level, the output driver 100 is configured to operate as a totem-pole driver. The OD signal is controlled by a user interface. For example, the logic value of the OD signal may be programmed in the EEPROM coupled to the PCI bus interface unit 16 via the EEPROM interface 42.

The output of the AND gate 106 via an inverter 108 is coupled to an input of an AND gate 110, the other input of which is supplied with the output enable signal EN. This signal controls data output from the output driver 100 in both open-drain and totem-pole modes of operation. For example, the EN signal may be represented by interrupt enabling bits in the PCI registers 17.

When the output driver 100 is configured to operate in the totem-pole drive mode, the EN signal set at a logic 1 level may enable data output from the output pin 104. When the EN signal is set at a logic 0 level, the data output may be disabled.

In the open-drain drive mode, the EN signal set at a logic 0 level may prevent data output from the output pin 104. If the EN signal is set at a logic 1 level, a low level at the data input A may result in a low level data signal at the output pin 104. However, a high level at the data input A may cause a high-impedance state at the output O.

The output of the AND gate 110 is supplied to the output enable input EN of the totem-pole output driver 102. The data input A of the driver 102 is coupled to the data input A of the driver 100.

FIG. 6 shows a table illustrating logic values at the output O, and a drive mode of the output driver 100 depending on logic values of the open-drain control signal OD, output enable signal EN and data input signal A. When the OD signal is set at a logic 0 level, the output driver 100 operates in a totem-pole drive mode. If the OD signal is set at a logic 1 level, the output driver 100 is configured to operate in an open-drain drive mode.

In both the totem-pole drive mode and the open-drain drive mode, if the EN signal is set to a logic 0 level, the output O is brought into a high-impedance state regardless of a logic value at the data input A. Accordingly, the data output from the output pin 104 is disabled.

In the totem-pole drive mode, when the EN signal goes to a logic 1 level, the data input A set at a logic 0 level will cause a logic 0 level at the output O, whereas the data input A set at a logic 1 level will produce a logic 1 level at the output O.

In the open-drain drive mode, if the EN signal is set to a logic 1 level, a logic 0 value at the data input A will drive the output O to a logic 0 level. However, the output O will remain in a high-impedance state, when the data input A is at a logic 1 level.

Accordingly, the user is enabled to configure the output driver 100 to operate either in a totem-pole drive mode or in an open-drain drive mode depending on a particular application. For example, for applications that need an edge-sensitive interrupt signal, the totem-pole drive mode may be used. Thus, a single interrupt request output pin may be driven either in an open-drain mode, or in a totem-pole mode. Separate pins for an open-drain drive mode and a totem-pole drive mode are not required. As a result, the number of pins on a chip may be reduced.

There, accordingly, has been described an output driver that may be configured to operate as a totem-pole driver, or as an open-drain driver. The output driver comprises a totem-pole driver coupled to an output pin. A control circuit is coupled to the output enable input of the totem-pole driver. The control circuit is supplied with an open-drain control signal controlled by the user interface. When the open-drain control signal is at a first logic level, the output driver operates as an open-drain driver. When the open-drain control signal is at a second logic level, the output driver is configured to operate as a totem-pole driver.

In this disclosure, there are shown and described only the preferred embodiments of the invention, but it is to be understood that the invention is capable of changes and modifications within the scope of the inventive concept as expressed herein.

What is claimed is:

1. An output driver for driving an output pin on a chip, comprising:
   a totem-pole driver coupled to said output pin, and
   a control circuit supplied with a mode control signal and coupled to a control input of said totem-pole driver for configuring said totem-pole driver to operate in an open-drain drive mode when said mode control signal has a first logic value, and for configuring said totem-pole driver to operate in a totem-pole drive mode when said mode control signal has a second logic value,
   wherein said control circuit comprises:
   a first gate circuit having a first input supplied with a data input signal representing data to be supplied from said output pin, and a second input provided with said mode control signal, and
   a second gate circuit having a first input responsive to an output of said first gate circuit, and a second input supplied with an output enable signal.

2. The output driver of claim 1, wherein an output of said second gate circuit is coupled to the control input of said totem-pole driver.

3. The output driver of claim 2, wherein said totem-pole driver has a data input supplied with said data input signal.

4. The output driver of claim 1, wherein said mode control signal is programmed by a user.

5. An output driver for driving an output in a PCI interface, comprising:
   a driver of a first configuration coupled to said output, and
   a control circuit coupled to said driver for configuring said driver so as to imitate a driver of a second configuration,
   wherein said control circuit comprises:
      a first gate circuit having a first input supplied with a data input signal representing data to be supplied from said output, and a second input provided with a configuration selection signal, and
      a second gate circuit having a first input responsive to an output of said first gate circuit, and a second input supplied with an output enable signal.

6. The output driver of claim 5, wherein said control circuit is supplied with a configuration selection signal for imitating the driver of the second configuration when said configuration selection signal has a predetermined value.

7. The output driver of claim 6, wherein said driver of the first configuration comprises a totem-pole driver.

8. The output driver of claim 7, wherein said driver of the second configuration comprises an open-drain driver.

9. The output driver of claim 5, wherein said output is arranged for supplying an interrupt request signal to a host.

10. The output driver of claim 5, wherein an output of said second gate circuit is coupled to a control input of said driver of the first configuration.

11. The output driver of claim 10 wherein said driver of the first configuration has a data input supplied with said data input signal.

* * * * *